(12) United States Patent
Zhuang et al.

(10) Patent No.: US 7,955,524 B2
(45) Date of Patent: Jun. 7, 2011

(54) PHOSPHOR, ITS PREPARATION METHOD AND LIGHT EMITTING DEVICES USING THE SAME

(75) Inventors: Weidong Zhuang, Beijing (CN); Yunsheng Hu, Beijing (CN); Zhen Long, Beijing (CN); Xiaowei Huang, Beijing (CN); Hongwei Li, Beijing (CN); Shusheng Zhang, Beijing (CN); Huagiang He, Beijing (CN)

(73) Assignees: General Research Institute for Nonferrous Metals, Beijing, Beijing (CN); Grirem Advanced Materials Co., Ltd., Beijing (CN)

( * ) Notice: Subject to any disclaimer, the term of this patent is extended or adjusted under 35 U.S.C. 154(b) by 0 days.

(21) Appl. No.: 12/232,604

(22) Filed: Sep. 19, 2008

(65) Prior Publication Data
US 2009/0050918 A1     Feb. 26, 2009

Related U.S. Application Data

(63) Continuation of application No. PCT/CN2007/000852, filed on Mar. 16, 2007.

(30) Foreign Application Priority Data

Mar. 24, 2006 (CN) .......................... 2006 1 0065812

(51) Int. Cl.
*C09K 11/08* (2006.01)
*C09K 11/66* (2006.01)
*C09K 11/61* (2006.01)

(52) U.S. Cl. .......................... 252/301.4 H; 252/301.4 F

(58) Field of Classification Search ........... 252/301.4 H, 252/301.4 F
See application file for complete search history.

(56) References Cited

U.S. PATENT DOCUMENTS

| | | | |
|---|---|---|---|
| 7,029,602 B2 * | 4/2006 | Oshio | 252/301.4 R |
| 2001/0017514 A1 * | 8/2001 | Toda et al. | 313/486 |

* cited by examiner

*Primary Examiner* — C. Melissa Koslow
*Assistant Examiner* — Matthew E Hoban

(57) ABSTRACT

A phosphor can be excited by UV, purple or blue light LED, its preparation method, and light emitting devices incorporating the same. The phosphor contains rare earth, silicon, alkaline-earth metal, halogen, and oxygen, as well as aluminum or gallium. Its General formula of is $aLn_2O_3 \cdot MO \cdot bM'_2O_3 \cdot fSiO_2 \cdot cAX_e{:}dR$, wherein Ln is at least one metal element selected from a group consisting of Sc, Y, La, Pr, Nd, Gd, Ho, Yb and Sm; M is at least one metal element selected from a group consisting of Ca, Sr and Ba; M' is at least one metal element selected from Al and Ga; A is at least one metal element selected from a group consisting of Li, Na, K, Mg, Ca, Sr and Ba; X is at least one element selected from F and Cl; R is at least one metal element selected from a group consisting of Ce, Eu, Tb and Mn; $0.01 \leq a \leq 2$, $0.35 \leq b \leq 4$, $0.01 \leq c \leq 1$, $0.01 \leq d \leq 0.3$, $0.01 \leq f \leq 3$, $0.6 \leq e \leq 2.4$. The phosphor has broad emitting range, high efficiency, better uniformity and stability. A light emitting device is obtained by incorporating the phosphor into a UV, purple or blue light emitting device.

11 Claims, 1 Drawing Sheet

PHOSPHOR, ITS PREPARATION METHOD AND LIGHT EMITTING DEVICES USING THE SAME

CROSS REFERENCE TO RELATED APPLICATIONS

This application is a continuation application filed under 35 U.S.C. §111(a), claiming the benefit under 35 U.S.C. §120 and §365(c) of a PCT International Application Number PCT/CN2007/000852, filed Mar. 16, 2007, it being further noted that foreign priority benefit is based upon Chinese Patent Application 200610065812.X, filed Mar. 24, 2006 in the State Intellectual Property Office of P.R. China, the disclosures of which are thereby incorporated by reference.

FIELDS OF THE INVENTION

The present invention relates to a phosphor that can be excited by ultraviolet, purple or blue LEDs, the preparation method thereof, and light emitting devices using the same.

BACKGROUND OF THE INVENTION

Light emitting diodes ("LEDs") have attracted much attention due to many advantages, such as small volume, low power consumption, long lifetime, fast-response, environmental friendliness, and high reliability etc. They are used widely in indicating lamps, decorating lamps, signal lamps etc. It can be looked forward to the coming future that LEDs will access into general lighting field with the faster and advanced developments.

Generally, there are two ways to generate white LED: one way is to combine the red, green and blue LEDs to get white light; the other way is to excite phosphors with LED to obtain white light. According to the difference in phosphors, the latter approach includes three routes: matching yellow phosphor with blue LED, matching green and red phosphors with blue LED, or matching red, green and blue phosphors with purple or UV LEDs.

As for current LED techniques, white LEDs are preferred to be generated by incorporating blue LED with YAG (yttrium aluminum garnet) yellow phosphor. In the Chinese patent CN97196762, this phosphor is reported in details. However, due to the characteristics of the phosphor, the luminous efficiency of white LEDs using this YAG phosphor is not yet adequate at present, and it is not applicable in general lighting field by taking into account the energy-saving. Therefore, the studies on novel phosphors with good luminescence performance are focused by many researchers from all over the world.

A silicate-borate phosphor represented by the formula $(Y,La)_{1-x-y-z}Ce_xGd_yTb_z(Mg,Zn,Gd)_{1-p}Mn_pB_{5-q-s}(Al,Ga)_q X_sO_{10}$ has been reported in the German patent DE19730005. Phosphors comprising silicon, disclosed in British patents GB1334838, GB1326868 and GB1379949, with emission main peaks at 370-430 nm, are employed as cathode ray exciting phosphors. An alkaline-earth silicate phosphor that can be excited by blue light to generate yellow light, with similar performance as that of the YAG phosphor, has been developed by Barry (J. Electrochem. Soc., 1968, 115: 1181-1184), and has been described in white LED in U.S. Patent Publication US20040051111.

SUMMARY OF THE INVENTION

One aspect of the present invention is to provide a phosphor that possesses desirable chemical stability, high luminous efficiency and can be excited efficiently by ultraviolet, purple or blue LED's.

Another aspect of the present invention is to provide a preparation method for the phosphor mentioned above.

Still another aspect of the present invention is to provide a light emitting device that incorporates the above mentioned phosphor.

A phosphor according to one aspect of the invention contains, for example, rare earth, silicon, alkaline-earth metal, halogen, and oxygen, as well as aluminum or gallium. Rare earth refers to "rare earth elements" or "rare earth metals," and hereinafter, the expression "rare earth" will be used. The rare earth is at least one metal element selected from a group consisting of Sc, Y, La, Pr, Nd, Gd, Ho, Yb and Sm, as well as at least one metal element selected from a group consisting of Ce, Eu and Tb. The alkaline-earth metal is at least one metal element selected from a group consisting of Mg, Ca, Sr and Ba. The halogen is at least one element selected from F and Cl. The phosphor according to one aspect of the present invention possesses high conversion efficiency, and can be used to produce white LED with high luminous efficiency.

As one embodiment, the phosphor can be represented by the general formula of

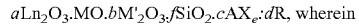

$a\text{Ln}_2\text{O}_3 \cdot \text{MO} \cdot b\text{M'}_2\text{O}_3 \cdot f\text{SiO}_2 \cdot c\text{AX}_e : d\text{R}$, wherein Ln is at least one metal element selected from a group consisting of Sc, Y, La, Pr, Nd, Gd, Ho, Yb and Sm;

M is at least one metal element selected from a group consisting of Ca, Sr and Ba;

M' is at least one metal element selected from Al and Ga;

A is at least one metal element selected from a group consisting of Li, Na, K, Mg, Ca, Sr and Ba;

X is at least one element selected from F and Cl;

R is at least one metal element selected from a group consisting of Ce, Eu, Tb and Mn;

$0.01 \leq a \leq 2$;
$0.35 \leq b \leq 4$;
$0.01 \leq c \leq 1$;
$0.01 \leq d \leq 0.3$;
$0.01 \leq f \leq 3$; and
$0.6 \leq e \leq 2.4$.

The phosphor according to the present invention has excellent luminescent properties such as wide exciting wavelength scope, efficient emitting transition and chemical stability, and can be excited by ultraviolet, purple or blue LED. New light emitting devices can be obtained by incorporating the phosphor into the LED.

A preparation method for the phosphor mentioned above includes the following:

(1) According to the general formula:

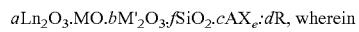

$a\text{Ln}_2\text{O}_3 \cdot \text{MO} \cdot b\text{M'}_2\text{O}_3 \cdot f\text{SiO}_2 \cdot c\text{AX}_e : d\text{R}$, wherein Ln is at least one metal element selected from a group consisting of Sc, Y, La, Pr, Nd, Gd, Ho, Yb and Sm;

M is at least one metal element selected from a group consisting of Ca, Sr and Ba;

M' is at least one metal element selected from Al and Ga;

A is at least one metal element selected from a group consisting of Li, Na, K, Mg, Ca, Sr and Ba;

X is at least one element selected from F and Cl;

R is at least one metal element selected from a group consisting of Ce, Eu, Tb and Mn;

$0.01 \leq a \leq 2$;
$0.35 \leq b \leq 4$;
$0.01 \leq c \leq 1$;
$0.01 \leq d \leq 0.3$;
$0.01 \leq f \leq 3$; and
$0.6 \leq e \leq 2.4$;

weighing elementary substance or compounds or salts of Ln, M, M', halide of A, and compounds or salts of R and Si as raw materials based on the stoichiometric ratio;

adding at the same time, excess quantity of $SiO_2$ and/or $AX_e$ as flux into the above raw materials, then mixing and grinding together to form a mixture.

(2) baking the mixture at high temperature under reducing atmosphere to form a baked product.

(3) Carrying out a post-treatment to the baked product to obtain the phosphor of the present invention.

According to (1) above, the compounds of Ln, M, M', A, R and Si are selected from oxide, hydroxide etc.; the salts are selected from the corresponding carbonate, nitrate, organic salt etc.

According to (1) above, the amount of the flux is 0.001-20 wt % by weight of the total phosphor.

According to (1) above, the starting materials can be mixed and grinded in alcohol, acetone or water.

According to (2) above, the operation of baking can be carried out once, twice or more.

According to (2) above, the temperature of baking is at 500~1600° C.

According to (2) above, each baking operation should last for 0.5~15 h.

According to (3) above, the post-treatment includes grinding, air flow crushing, washing, sifting, drying and grading, etc.

According to (3) above, the washing step in the post-treatment can be done by using acid solution, alkali solution or water.

According to (3) above, the grading step in the post-treatment can be carried out with at least one method selected from a group consisting of sedimentation method, sieving method, hydraulic classification and air flow grading.

It is easily found that the above preparation method of the present phosphor is advantageous for being very simple, involving no pollution and having low cost. Also, this phosphor can be excited by UV, purple or blue light to emit broadband visible light with wavelengths peaking at 500-600 nm and having full width at half maximum ("FWHM") beyond 30 nm. That is to say, the phosphor of the present invention can match UV, purple or blue LED, and can be implanted directly or along with other phosphors into LEDs to produce white or color light emitting devices.

In accordance with an aspect of the present invention, a light emitting device can be produced by combining the present phosphor with at least a kind of LED, such as UV, purple or blue LED. The phosphor contains rare earth, silicon, alkaline-earth metal, halogen, and oxygen, as well as aluminum or gallium. The rare earth is at least one metal element selected from a group consisting of Sc, Y, La, Pr, Nd, Gd, Ho, Yb and Sm as well as at least one metal element selected from a group consisting of Ce, Eu and Tb The alkaline-earth metal is at least one metal element selected from a group consisting of Mg, Ca, Sr and Ba. The halogen is at least one element selected from F and Cl.

The phosphor can be represented by the general formula of

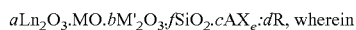

$aLn_2O_3 \cdot MO \cdot bM'_2O_3 \cdot fSiO_2 \cdot cAX_e \cdot dR$, wherein

Ln is at least one metal element selected from a group consisting of Sc, Y, La, Pr, Nd, Gd, Ho, Yb and Sm;

M is at least one metal element selected from a group consisting of Ca, Sr and Ba;

M' is at least one metal element selected from Al and Ga;

A is at least one metal element selected from a group consisting of Li, Na, K, Mg, Ca, Sr and Ba;

X is at least one element selected from F and Cl;

R is at least one metal element selected from a group consisting of Ce, Eu, Tb and Mn;

$0.01 \leq a \leq 2$,
$0.35 \leq b \leq 4$,
$0.01 \leq c \leq 1$,
$0.01 \leq d \leq 0.3$,
$0.01 \leq f \leq 3$, and
$0.6 \leq e \leq 2.4$.

The above-described phosphor of the present invention has excellent luminescent properties and stability with novel composition.

The preparation method for the phosphor is simple, involving no pollution and having lower cost.

A light emitting device is obtained by incorporating the phosphor into an LED, which has long lifetime and high luminous efficiency.

DESCRIPTION OF THE EXAMPLES

In order to further illustrate the present invention and the advantages thereof, the following specific examples are given, it being understood that the same are intended only as illustrative and in nowise limitative. The scope of protection of this invention will be further embodied in the claims.

Example 1

Figure 1:
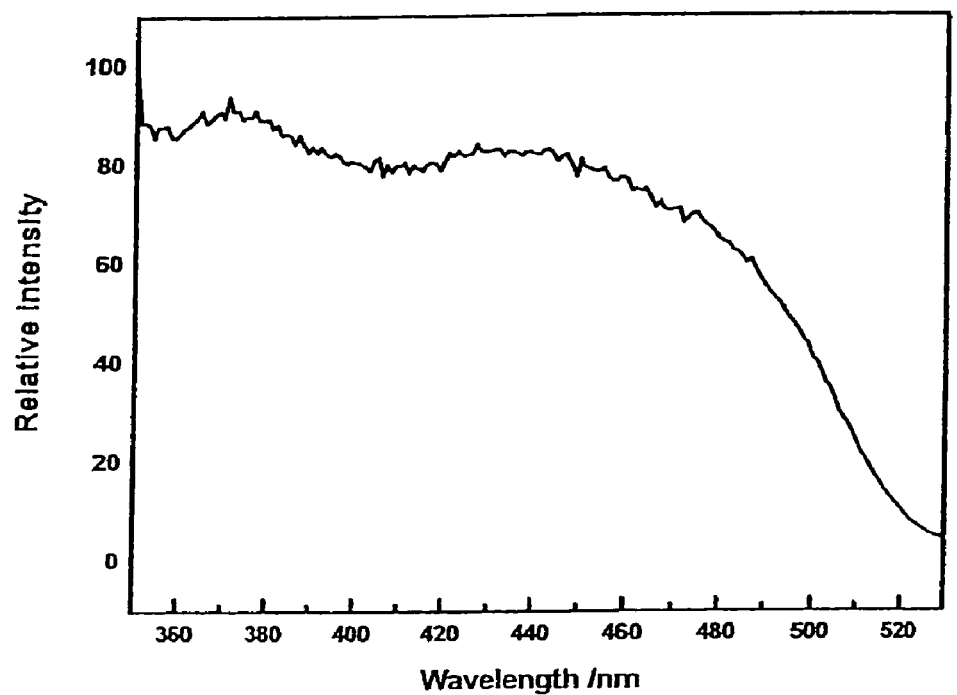
FIG. 1 shows the excitation spectrum of Example 1.
Figure 2:
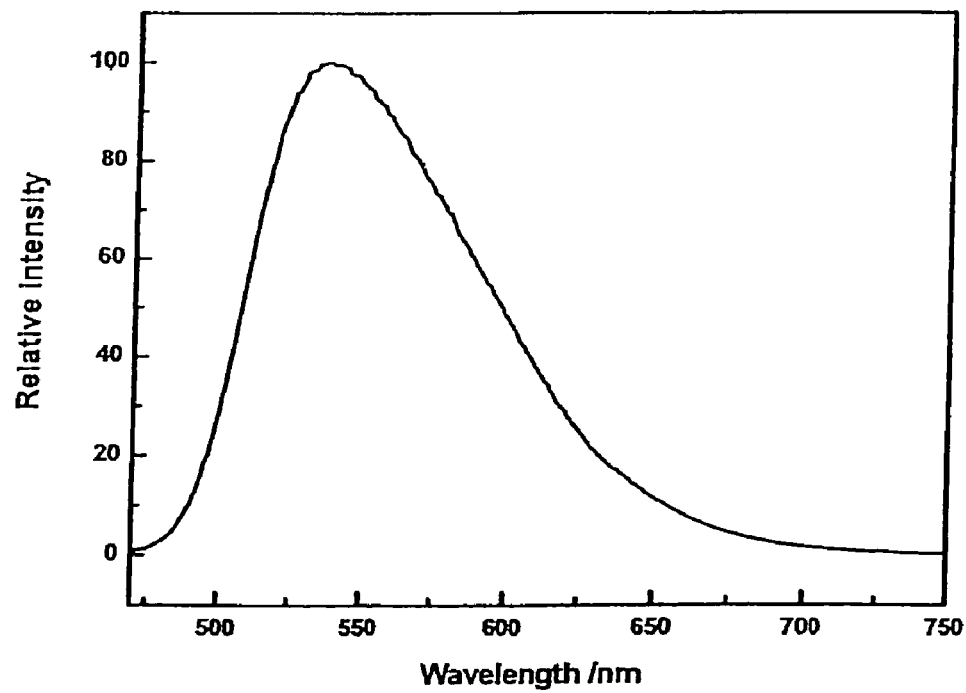
FIG. 2 shows the emission spectrum of the Example 1.

In this example, the formula of the phosphor is verified as $1.47Y_2O_3 \cdot BaO \cdot 2.48Al_2O_3 \cdot 1.03SiO_2 \cdot 0.03BaF_2 : 0.03Ce$, 0.01Eu. Raw materials $Y_2O_3(4N)$, $BaO(4N)$, $Al_2O_3(4N)$, $CeO_2(4N)$, $Eu_2O_3(4N)$, $SiO_2(4N)$, $BaF_2(AR)$, are weighed with appropriate stoichiometric ratio. $SiO_2$ and $BaF_2$ act as both reactant and flux. The amount of flux is 18 wt % by weight of above raw materials, and the weight ratio of the flux, $SiO_2$ and $BaF_2$, is 1:1. Mixing and grinding these materials, and then baking them at 1450° C. for 3 hours under reducing atmosphere. After crushing, washing, sifting, drying and sieving, the phosphor can be obtained. As shown in FIG. 1, the phosphor can be excited by 350-480 nm and emit 544 nm yellow light.

Example 2

In this example, the formula of the phosphor is verified as $1.47Y_2O_3 \cdot BaO \cdot 2.47Al_2O_3 \cdot 1.03SiO_2 \cdot 0.06BaF_2 : 0.04Ce$, 0.03Eu. Raw materials $Y_2O_3(4N)$, $BaO(4N)$, $Al_2O_3(4N)$, $CeO_2(4N)$, $Eu_2O_3(4N)$, $SiO_2(4N)$, $BaF_2(AR)$, are weighed with appropriate stoichiometric ratio. $SiO_2$ and $BaF_2$ act as both reactant and flux. The amount of flux is 10 wt % by weight of above raw materials, wherein the weight ratio of $SiO_2$ and $BaF_2$ is 1:1. The preparation method is similar as that of Example 1 but with different roasting times, temperature and period and taking crushing and sifting during the intermission of two-stage baking, namely, first, baking at 1400° C. for 2 hours in reducing atmosphere, then crushing, sieving and baking at 1550° C. for 2 hours in reducing atmosphere. After crushing, washing, sieving and drying, the phosphor can be obtained. The relative emission intensity is shown in Table 1.

Examples 3-72

In these examples, the formulae of the phosphors are listed in Table 1. In EXAMPLES 3-72, raw materials: oxides of Ln, M and M', halide of A (AXe), oxides of R, and oxides of Si (SiO$_2$), are weighed in accordance with the stoichiometric ratio of the formula of each embodiment. The oxides of Si and the halide of A may act as both reactant and flux. The amount of flux is 10 wt % by weight of above raw materials, wherein the weight ratio of the flux, oxides of Si and halide of A, is 1:1.

The preparation step is similar as that of EXAMPLE 2, namely, first, baking at 1400° C. for 2 hours in reducing atmosphere, then crushing, sieving and baking at 1550° C. for 2 hours in reducing atmosphere. After crushing, washing, sieving and drying, the phosphor can be obtained. The relative emission intensity is showed in Table 1.

TABLE 1

The formulae and emission intensity of EXAMPLES 1-72

| EXAMPLES | Formula | Relative Intensity (%) Excited by 330 nm | Excited by 460 nm |
|---|---|---|---|
| 1 | 1.47Y$_2$O$_3$•BaO•2.48Al$_2$O$_3$•1.03SiO$_2$•0.03BaF$_2$:0.03Ce, 0.01Eu | 100 | 100 |
| 2 | 1.47Y$_2$O$_3$•BaO•2.47Al$_2$O$_3$•1.03SiO$_2$•0.06BaF$_2$:0.04Ce, 0.03Eu | 105 | 106 |
| 3 | Y$_2$O$_3$•0.48Sm$_2$O$_3$•BaO•2.45Al$_2$O$_3$•1.09SiO$_2$•0.06BaF$_2$:0.03Ce, 0.04Eu | 96 | 97 |
| 4 | La$_2$O$_3$•0.22Gd$_2$O$_3$•0.25Sm$_2$O$_3$•BaO•2.44Al$_2$O$_3$•1.12SiO$_2$•0.06BaF$_2$:0.06Ce, 0.01Eu, 0.001Tb | 94 | 94 |
| 5 | 2.0Y$_2$O$_3$•BaO•1.0Al$_2$O$_3$•0.05Ga$_2$O$_3$•2.5SiO$_2$•0.36BaF$_2$:0.07Ce, 0.03Eu, 0.001Tb | 90 | 91 |
| 6 | 1.91Y$_2$O$_3$•BaO•2.0Al$_2$O$_3$•1.06SiO$_2$•0.1LiF:0.09Ce, 0.02Eu, 0.001Tb | 104 | 106 |
| 7 | 1.34Pr$_2$O$_3$•BaO•2.5Al$_2$O$_3$•1.09SiO$_2$•0.16LiCl:0.01Ce, 0.08Eu, 0.002Tb | 108 | 110 |
| 8 | 0.818Y$_2$O$_3$•BaO•3.0Al$_2$O$_3$•1.12SiO$_2$•0.2NaF:0.1Ce, 0.04Eu, 0.003Tb | 106 | 105 |
| 9 | 0.297Y$_2$O$_3$•BaO•3.5Al$_2$O$_3$•1.15SiO$_2$•0.2NaCl:0.12Ce, 0.02Eu, 0.004Tb | 103 | 104 |
| 10 | 0.01Y$_2$O$_3$•BaO•4.0Al$_2$O$_3$•0.01SiO$_2$•0.918KF:0.02Ce, 0.1Eu, 0.001Tb | 112 | 115 |
| 11 | 1.473Nd$_2$O$_3$•BaO•2.79Al$_2$O$_3$•0.05SiO$_2$•0.37KCl:0.02Ce, 0.11Eu, 0.002Tb | 91 | 92 |
| 12 | 1.471Y$_2$O$_3$•BaO•2.81Al$_2$O$_3$•0.1SiO$_2$•0.28MgF$_2$:0.1Ce, 0.12Eu, 0.003Mn | 90 | 89 |
| 13 | 1.472Y$_2$O$_3$•BaO•2.61Al$_2$O$_3$•0.5SiO$_2$•0.28MgCl$_2$:0.13Ce, 0.01Eu, 0.001Mn | 82 | 84 |
| 14 | 1.482Y$_2$O$_3$•BaO•2.215Al$_2$O$_3$•1.0SiO$_2$•0.57CaF$_2$:0.01Ce, 0.12Eu, 0.004Mn | 94 | 95 |
| 15 | 1.133Ho$_2$O$_3$•BaO•2.2Al$_2$O$_3$•2.0SiO$_2$•0.3CaCl$_2$:0.1Ce, 0.02Eu, 0.001Tb | 97 | 96 |
| 16 | 0.8Y$_2$O$_3$•BaO•0.42Al$_2$O$_3$•3.0SiO$_2$•0.16SrF$_2$:0.01Ce, 0.1Eu, 0.003Tb | 89 | 92 |
| 17 | 1.47Y$_2$O$_3$•BaO•2.42Al$_2$O$_3$•SiO$_2$•0.16SrCl$_2$:0.1Ce, 0.04Eu | 88 | 89 |
| 18 | Yb$_2$O$_3$•0.47Gd$_2$O$_3$•BaO•2.24Al$_2$O$_3$•1.36SiO$_2$•0.16LiF:0.13Ce, 0.01Eu | 92 | 93 |
| 19 | Y$_2$O$_3$•0.44Gd$_2$O$_3$•BaO•2.25Al$_2$O$_3$•1.39SiO$_2$•0.16LiCl:0.08Ce, 0.09Eu | 91 | 93 |
| 20 | Y$_2$O$_3$•0.44Gd$_2$O$_3$•BaO•2.21Al$_2$O$_3$•1.42SiO$_2$•0.16NaF:0.09Ce, 0.02Eu | 94 | 95 |
| 21 | Y$_2$O$_3$•0.41Gd$_2$O$_3$•BaO•2.195Al$_2$O$_3$•1.45SiO$_2$•0.16NaCl:0.15Ce, 0.13Eu | 88 | 89 |
| 22 | Y$_2$O$_3$•0.41Gd$_2$O$_3$•BaO•2.18Al$_2$O$_3$•1.48SiO$_2$•0.16KF:0.01Ce, 0.01Eu | 91 | 92 |
| 23 | Y$_2$O$_3$•0.38Gd$_2$O$_3$•CaO•2.42Al$_2$O$_3$•1.48SiO$_2$•0.16KCl:0.03Ce, 0.03Eu | 86 | 87 |
| 24 | Y$_2$O$_3$•0.38Gd$_2$O$_3$•CaO•2.165Al$_2$O$_3$•1.51SiO$_2$•0.16MgF$_2$:0.08Ce, 0.002Tb | 94 | 95 |
| 25 | Y$_2$O$_3$•0.35Sc$_2$O$_3$•CaO•2.15Al$_2$O$_3$•1.54SiO$_2$•0.16MgCl$_2$:0.02Ce, 0.005Tb | 89 | 91 |
| 26 | Y$_2$O$_3$•0.35Gd$_2$O$_3$•CaO•2.3Al$_2$O$_3$•1.12SiO$_2$•0.16CaF$_2$:0.04Ce, 0.001Tb | 102 | 101 |
| 27 | Y$_2$O$_3$•0.32Gd$_2$O$_3$•CaO•2.135Al$_2$O$_3$•1.57SiO$_2$•0.16CaCl$_2$:0.07Ce, 0.08Eu | 92 | 93 |
| 28 | Y$_2$O$_3$•0.32La$_2$O$_3$•CaO•2.12Al$_2$O$_3$•1.6SiO$_2$•0.16SrF$_2$:0.02Ce, 0.12Eu | 89 | 90 |
| 29 | Y$_2$O$_3$•0.29Gd$_2$O$_3$•CaO•2.105Al$_2$O$_3$•1.63SiO$_2$•0.16SrCl$_2$:0.14Ce, 0.02Eu | 87 | 88 |
| 30 | Y$_2$O$_3$•0.29Pr$_2$O$_3$•CaO•2.09Al$_2$O$_3$•1.66SiO$_2$•0.16BaCl$_2$:0.02Ce, 0.02Eu | 93 | 94 |
| 31 | Y$_2$O$_3$•0.26Sm$_2$O$_3$•CaO•2.125Al$_2$O$_3$•1.74SiO$_2$•0.01LiF:0.06Ce, 0.06Eu | 100 | 101 |
| 32 | Y$_2$O$_3$•0.26Sm$_2$O$_3$•CaO•2.11Al$_2$O$_3$•1.75SiO$_2$•0.03LiCl:0.09Ce, 0.08Eu | 98 | 100 |
| 33 | Y$_2$O$_3$•0.23Sm$_2$O$_3$•CaO•2.095Al$_2$O$_3$•1.75SiO$_2$•0.06NaF:0.06Ce, 0.07Eu | 102 | 103 |
| 34 | Y$_2$O$_3$•0.23Sm$_2$O$_3$•CaO•2.08Al$_2$O$_3$•1.74SiO$_2$•0.1NaCl:0.05Ce, 0.08Eu | 96 | 97 |
| 35 | Y$_2$O$_3$•0.2Sm$_2$O$_3$•CaO•2.065Al$_2$O$_3$•1.67SiO$_2$•0.2KF:0.16Ce, 0.13Eu | 97 | 98 |
| 36 | Y$_2$O$_3$•0.2Sm$_2$O$_3$•CaO•2.05Al$_2$O$_3$•1.6SiO$_2$•0.3KCl:0.15Ce, 0.13Eu | 101 | 102 |
| 37 | Y$_2$O$_3$•0.47Sm$_2$O$_3$•CaO•2.23Al$_2$O$_3$•0.9SiO$_2$•0.4MgF$_2$:0.13Ce, 0.1Eu | 96 | 97 |
| 38 | Y$_2$O$_3$•0.47Nd$_2$O$_3$•CaO•2.035Al$_2$O$_3$•1.43SiO$_2$•0.5MgCl$_2$:0.04Ce, 0.04Eu | 96 | 95 |
| 39 | Y$_2$O$_3$•0.47Sm$_2$O$_3$•CaO•2.02Al$_2$O$_3$•1.36SiO$_2$•0.6CaF$_2$:0.02Ce, 0.03Eu | 91 | 92 |
| 40 | Y$_2$O$_3$•0.47Sm$_2$O$_3$•CaO•2.005Al$_2$O$_3$•1.29SiO$_2$•0.7CaCl$_2$:0.12Ce, 0.03Eu | 86 | 87 |
| 41 | Y$_2$O$_3$•0.47Sm$_2$O$_3$•CaO•1.99Al$_2$O$_3$•1.22SiO$_2$•0.8SrF$_2$:0.13Ce, 0.04Eu | 88 | 89 |
| 42 | Y$_2$O$_3$•0.47Sm$_2$O$_3$•CaO•2.46Al$_2$O$_3$•0.18SiO$_2$•0.9SrCl$_2$:0.14Ce, 0.05Eu | 85 | 86 |
| 43 | Y$_2$O$_3$•0.47Ho$_2$O$_3$•CaO•2.45Al$_2$O$_3$•0.1SiO$_2$•1.0BaCl$_2$:0.06Ce, 0.06Eu | 96 | 97 |
| 44 | 1.47Y$_2$O$_3$•CaO•2.39Al$_2$O$_3$•0.05Ga$_2$O$_3$•1.08SiO$_2$•0.1LiF:0.08Ce, 0.05Eu | 99 | 100 |
| 45 | 0.01Y$_2$O$_3$•CaO•3.84Al$_2$O$_3$•0.05Ga$_2$O$_3$•1.00SiO$_2$•0.2LiCl:0.11Ce, 0.02Eu | 103 | 102 |
| 46 | 0.05Yb$_2$O$_3$•CaO•3.36Al$_2$O$_3$•0.05Ga$_2$O$_3$•1.3SiO$_2$•0.3NaF:0.1Ce, 0.05Eu | 108 | 107 |
| 47 | 0.1Y$_2$O$_3$•CaO•3.74Al$_2$O$_3$•0.05Ga$_2$O$_3$•0.82SiO$_2$•0.4NaCl:0.1Ce, 0.03Eu | 93 | 94 |
| 48 | 0.5Y$_2$O$_3$•CaO•3.33Al$_2$O$_3$•0.05Ga$_2$O$_3$•0.74SiO$_2$•0.5KF:0.09Ce, 0.02Eu | 90 | 91 |
| 49 | 1.0Y$_2$O$_3$•CaO•2.82Al$_2$O$_3$•0.05Ga$_2$O$_3$•0.66SiO$_2$•0.6KCl:0.08Ce | 85 | 86 |
| 50 | 2.0Y$_2$O$_3$•CaO•1.81Al$_2$O$_3$•0.05Ga$_2$O$_3$•0.55SiO$_2$•0.7MgF$_2$:0.1Eu | 96 | 97 |
| 51 | 0.01Sc$_2$O$_3$•SrO•3.79Al$_2$O$_3$•0.05Ga$_2$O$_3$•0.44SiO$_2$•0.8MgCl$_2$:0.007Ce, 0.01Eu | 100 | 100 |
| 52 | 0.05Y$_2$O$_3$•SrO•3.74Al$_2$O$_3$•0.05Ga$_2$O$_3$•0.36SiO$_2$•0.9CaF$_2$:0.06Ce, 0.04Eu | 93 | 92 |
| 53 | 0.1Y$_2$O$_3$•SrO•3.68Al$_2$O$_3$•0.05Ga$_2$O$_3$•0.28SiO$_2$•1.0CaCl$_2$:0.06Ce, 0.03Eu | 96 | 97 |
| 54 | 0.5Y$_2$O$_3$•SrO•3.27Al$_2$O$_3$•0.05Ga$_2$O$_3$•1.2SiO$_2$•0.1SrF$_2$:0.07Ce, 0.04Eu | 94 | 94 |
| 55 | 1.0La$_2$O$_3$•SrO•2.76Al$_2$O$_3$•0.05Ga$_2$O$_3$•1.12SiO$_2$•0.2SrCl$_2$:0.09Ce, 0.03Eu | 90 | 91 |
| 56 | 2.0Y$_2$O$_3$•SrO•1.75Al$_2$O$_3$•0.05Ga$_2$O$_3$•1.04SiO$_2$•0.3BaCl$_2$:0.1Ce, 0.1Eu | 105 | 106 |
| 57 | 0.47Pr$_2$O$_3$•0.5Gd$_2$O$_3$•0.5Sm$_2$O$_3$•SrO•2.3Al$_2$O$_3$•1.34SiO$_2$•0.06BaF$_2$:0.1Ce, 0.11Eu | 90 | 90 |
| 58 | 0.47Y$_2$O$_3$•Gd$_2$O$_3$•SrO•2.29Al$_2$O$_3$•1.36SiO$_2$•0.06BaF$_2$:0.07Ce, 0.02Eu | 89 | 88 |
| 59 | 0.47Y$_2$O$_3$•Gd$_2$O$_3$•SrO•2.23Al$_2$O$_3$•1.38SiO$_2$•0.12LiF:0.12Ce, 0.02Eu | 87 | 86 |
| 60 | 0.47Nd$_2$O$_3$•Gd$_2$O$_3$•SrO•2.22Al$_2$O$_3$•1.4SiO$_2$•0.12LiCl:0.02Ce, 0.11Eu | 86 | 87 |
| 61 | 0.44Y$_2$O$_3$•Gd$_2$O$_3$•SrO•2.21Al$_2$O$_3$•1.42SiO$_2$•0.12NaF:0.02Ce, 0.02Eu | 87 | 85 |
| 62 | 0.44Y$_2$O$_3$•Gd$_2$O$_3$•SrO•2.2Al$_2$O$_3$•1.44SiO$_2$•0.12NaCl:0.08Ce, 0.08Eu | 85 | 84 |
| 63 | 0.41Y$_2$O$_3$•Gd$_2$O$_3$•SrO•2.19Al$_2$O$_3$•1.43SiO$_2$•0.12KF:0.07Ce, 0.01Eu | 83 | 84 |
| 64 | 0.41Y$_2$O$_3$•Gd$_2$O$_3$•SrO•2.42Al$_2$O$_3$•1.18SiO$_2$•0.12KCl:0.01Ce, 0.03Eu | 83 | 83 |
| 65 | 0.38Y$_2$O$_3$•Gd$_2$O$_3$•SrO•2.19Al$_2$O$_3$•1.46SiO$_2$•0.06MgF$_2$:0.08Ce, 0.10Eu | 89 | 91 |

TABLE 1-continued

The formulae and emission intensity of EXAMPLES 1-72

| EXAMPLES | Formula | Relative Intensity (%) | |
|---|---|---|---|
| | | Excited by 330 nm | Excited by 460 nm |
| 66 | $0.38Y_2O_3 \cdot Gd_2O_3 \cdot SrO \cdot 2.18Al_2O_3 \cdot 1.48SiO_2 \cdot 0.06MgCl_2:0.1Ce, 0.1Eu, 0.1Tb$ | 88 | 87 |
| 67 | $0.35Y_2O_3 \cdot Gd_2O_3 \cdot SrO \cdot 1.46Al_2O_3 \cdot 1.96SiO_2 \cdot 0.06CaF_2:0.16Ce$ | 105 | 104 |
| 68 | $0.35Pr_2O_3 \cdot Gd_2O_3 \cdot SrO \cdot 2.17Al_2O_3 \cdot 1.5SiO_2 \cdot 0.06CaCl_2:0.12Ce, 0.12Eu$ | 81 | 84 |
| 69 | $0.32Y_2O_3 \cdot Gd_2O_3 \cdot SrO \cdot 2.12Al_2O_3 \cdot 1.6SiO_2 \cdot 0.06SrF_2:0.12Ce, 0.10Eu$ | 82 | 83 |
| 70 | $0.32Y_2O_3 \cdot Gd_2O_3 \cdot SrO \cdot 2.07Al_2O_3 \cdot 1.7SiO_2 \cdot 0.06SrCl_2:0.08Ce, 0.12Eu$ | 78 | 79 |
| 71 | $0.29Y_2O_3 \cdot Gd_2O_3 \cdot SrO \cdot 2.02Al_2O_3 \cdot 1.8SiO_2 \cdot 0.06BaF_2:0.06Ce, 0.10Eu$ | 80 | 78 |
| 72 | $0.29Nd_2O_3 \cdot Gd_2O_3 \cdot SrO \cdot 1.97Al_2O_3 \cdot 1.9SiO_2 \cdot 0.06BaCl_2:0.08Ce, 0.10Eu$ | 86 | 84 |

Example 73

White light emitting device can be obtained by incorporating the phosphor of EXAMPLE 1 into a blue light LED. The phosphor powder of EXAMPLE 1 is firstly slurried, and then coated on a GaInN LED chip. After welding circuit and packaging, a white light emitting device is produced.

INDUSTRIAL APPLICABILITY

The above-described phosphor has broad emitting range, high efficiency, better uniformity and stability. The production method is simple, no pollution and a lower cost. A light emitting device can be obtained by incorporating this phosphor into a UV, purple or blue light emitting device.

What is claimed is:

1. A phosphor represented by a general formula of:

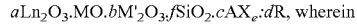

$a\text{Ln}_2O_3 \cdot \text{MO} \cdot b\text{M'}_2O_3 \cdot f\text{SiO}_2 \cdot c\text{AX}_e \text{:} d\text{R}$, wherein Ln is at least one metal element selected from a group consisting of Sc, Y, La, Pr, Nd, Gd, Ho, Yb and Sm;
M is at least one metal element selected from a group consisting of Ca, Sr and Ba;
M' is at least one metal element selected from Al and Ga;
A is at least one metal element selected from a group consisting of Li, Na, K, Mg, Ca, Sr and Ba;
X is at least one element selected from F and Cl;
R is at least one metal element selected from a group consisting of Ce, Eu, Tb and Mn;
$0.01 \leq a \leq 2$;
$0.35 \leq b \leq 4$;
$0.01 \leq c \leq 1$,
$0.01 \leq d \leq 0.3$;
$0.01 \leq f \leq 3$; and
$0.6 \leq e \leq 2.4$, wherein the phosphor is a member selected from the group consisting of:

$1.47Y_2O_3.BaO.2.48Al_2O_3.1.03SiO_2.0.03BaF_2:0.03Ce, 0.01Eu$
$1.47Y_2O_3.BaO.2.47Al_2O_3.1.03SiO_2.0.06BaF_2:0.04Ce, 0.03Eu$
$Y_2O_3.0.48Sm_2O_3.BaO.2.45Al_2O_3.1.09SiO_2.0.06BaF_2:0.03Ce,0.04Eu$
$La_2O_3.0.22Gd_2O_3.0.25Sm_2O_3.BaO.2.44Al_2O_3.1.12SiO_2.0.06BaF_2:0.06Ce,0.01Eu,0.001Tb$
$2.0Y_2O_3.BaO.1.0Al_2O_3.0.05Ga_2O_3.2.5SiO_2.0.36BaF_2:0.07Ce,0.03Eu,0.001Tb$
$1.91Y_2O_3.BaO.2.01Al_2O_3.1.06SiO_2.0.1LiF:0.09Ce, 0.02Eu,0.001Tb$
$1.34Pr_2O_3.BaO.2.5Al_2O_3.1.09SiO_2.0.16LiCl:0.01Ce, 0.08Eu,0.002Tb$
$0.818Y_2O_3.BaO.3.0Al_2O_3.1.12SiO_2.0.2NaF:0.1Ce, 0.04Eu,0.003Tb$
$0.297Y_2O_3.BaO.3.5Al_2O_3.1.15SiO_2.0.2NaCl:0.12Ce, 0.02Eu,0.004Tb$
$0.01Y_2O_3.BaO.4.0Al_2O_3.0.01SiO_2.0.918KF:0.02Ce, 0.1Eu,0.001Tb$
$1.473Nd_2O_3.BaO.2.79Al_2O_3.0.05SiO_2.0.37KCl:0.02Ce, 0.11Eu,0.002Tb$
$1.471Y_2O_3.BaO.2.81Al_2O_3.0.1SiO_2.0.28MgF_2:0.1Ce, 0.12Eu,0.003Mn$
$1.472Y_2O_3.BaO.2.61Al_2O_3.0.5SiO_2.0.28MgCl_2:0.13Ce, 0.01Eu,0.001Mn$
$1.482Y_2O_3.BaO.2.215Al_2O_3.1.0SiO_2.0.57CaF_2:0.01Ce, 0.12Eu,0.004Mn$
$1.133Ho_2O_3.BaO.2.2Al_2O_3.2.0SiO_2.0.3CaCl_2:0.1Ce, 0.02Eu,0.001Tb$
$0.8Y_2O_3.BaO.0.42Al_2O_3.3.0SiO_2.0.16SrF_2:0.01Ce, 0.1Eu,0.003Tb$
$1.47Y_2O_3.BaO.2.42Al_2O_3SiO_2.0.16SrCl_2:0.1Ce,0.04Eu$
$Yb_2O_3.0.47Gd_2O_3.BaO.2.24Al_2O_3.1.36SiO_2.0.16LiF: 0.13Ce,0.01Eu$
$Y_2O_3.0.44Gd_2O_3.BaO.2.25Al_2O_3.1.39SiO_2.0.16LiCl: 0.08Ce,0.09Eu$
$Y_2O_3.0.44Gd_2O_3.BaO.2.21Al_2O_3.1.42SiO_2.0.16NaF: 0.09Ce,0.02Eu$
$Y_2O_3.0.41Gd_2O_3.BaO.2.195Al_2O_3.1.45SiO_2.0.16NaCl: 0.15Ce,0.13Eu$
$Y_2O_3.0.41Gd_2O_3.BaO.2.18Al_2O_3.1.48SiO_2.0.16KF: 0.01Ce,0.01Eu$
$Y_2O_3.0.38Gd_2O_3.CaO.2.42Al_2O_3.1.48SiO_2.0.16KCl: 0.03Ce,0.03Eu$
$Y_2O_3.0.38Gd_2O_3.CaO.2.165Al_2O_3.1.51SiO_2.0.16MgF_2: 0.08Ce,0.002Tb$
$Y_2O_3.0.35Sc_2O_3.CaO.2.15Al_2O_3.1.54SiO_2.0.16MgCl_2: 0.02Ce,0.005Tb$
$Y_2O_3.0.35Gd_2O_3.CaO.2.3Al_2O_3.1.12SiO_2.0.16CaF_2: 0.04Ce,0.001Tb$
$Y_2O_3.0.32Gd_2O_3.CaO.2.135Al_2O_3.1.57SiO_2.0.16CaCl_2: 0.07Ce,0.08Eu$
$Y_2O_3.0.32La_2O_3.CaO.2.12Al_2O_3.1.6SiO_2.0.16SrF_2: 0.02Ce,0.12Eu$
$Y_2O_3.0.29Gd_2O_3CaO.2.105Al_2O_3.1.63SiO_2.0.16SrCl_2: 0.14Ce,0.02Eu$
$Y_2O_3.0.29Pr_2O_3CaO.2.09Al_2O_3.1.66SiO_2.0.16BaCl_2: 0.02Ce,0.02Eu$
$Y_2O_3.0.26Sm_2O_3.CaO.2.125Al_2O_3.1.74SiO_2.0.01LiF: 0.06Ce,0.06Eu$
$Y_2O_3.0.26Sm_2O_3.CaO.2.11Al_2O_3.1.75SiO_2.0.03LiCl: 0.09Ce,0.08Eu$
$Y_2O_3.0.23Sm_2O_3.CaO.2.095Al_2O_3.1.75SiO_2.0.06NaF: 0.06Ce,0.07Eu$
$Y_2O_3.0.23Sm_2O_3.CaO.2.08Al_2O_3.1.74SiO_2.0.1NaCl: 0.05Ce,0.08Eu$ $Y_2O_3.0.2Sm_2O_3.CaO.2.065Al_2O_3.1.67SiO_2.0.2KF$:
0.16Ce,0.13Eu
$Y_2O_3.0.2Sm_2O_3.CaO.2.05Al_2O_3.1.6SiO_2.0.3KCl$:
0.15Ce,0.13Eu
$Y_2O_3.0.47Sm_2O_3.CaO.2.23Al_2O_3.0.9SiO_2.0.4MgF_2$:
0.13Ce,0.1Eu
$Y_2O_3.0.47Nd_2O_3.CaO.2.035Al_2O_3.1.43SiO_2.0.5MgCl_2$:
0.04Ce,0.04Eu
$Y_2O_3.0.47Sm_2O_3.CaO.2.02Al_2O_3.1.36SiO_2.0.6CaF_2$:
0.02Ce,0.03Eu
$Y_2O_3.0.47Sm_2O_3.CaO.2.005Al_2O_3.1.29SiO_2.0.7CaCl_2$:
0.12Ce,0.03Eu
$Y_2O_3.0.47Sm_2O_3.CaO.1.99Al_2O_3.1.22SiO_2.0.8SrF_2$:
0.13Ce,0.04Eu
$Y_2O_3.0.47Sm_2O_3.CaO.2.46Al_2O_3.0.18SiO_2.0.9SrCl_2$:
0.14Ce,0.05Eu
$Y_2O_3.0.47Ho_2O_3.CaO.2.45Al_2O_3.0.1SiO_2.1.0BaCl_2$:
0.06Ce,0.06Eu
$1.47Y_2O_3.CaO.2.39Al_2O_3.0.05Ga_2O_3.1.08SiO_2.0.1LiF$:
0.08Ce,0.05Eu
$0.01Y_2O_3CaO.3.84Al_2O_3.0.05Ga_2O_3.1.00SiO_2.0.2LiCl$:
0.11Ce,0.02Eu
$0.05Yb_2O_3CaO.3.36Al_2O_3.0.05Ga_2O_3.1.3SiO_2.0.3NaF$:
0.1Ce,0.05Eu
$0.1Y_2O_3CaO.3.74Al_2O_3.0.05Ga_2O_3.0.82SiO_2.0.4NaCl$:
0.1Ce,0.03Eu
$0.5Y_2O_3CaO.3.33Al_2O_3.0.05Ga_2O_3.0.74SiO_2.0.5KF$:
0.09Ce,0.02Eu
$1.0Y_2O_3CaO.2.82Al_2O_3.0.05Ga_2O_3.0.66SiO_2.0.6KCl$:
0.08Ce
$2.0Y_2O_3CaO.1.81Al_2O_3.0.05Ga_2O_3.0.55SiO_2.0.7MgF_2$:
0.1Eu
$0.01Sc_2O_3.SrO.3.79Al_2O_3.0.05Ga_2O_3.0.44SiO_2.0.8MgCl_2$:0.007Ce,0.01Eu
$0.05Y_2O_3.SrO.3.74Al_2O_3.0.05Ga_2O_3.0.36SiO_2.0.9CaF_2$:
0.06Ce,0.04Eu
$0.1Y_2O_3.SrO.3.68Al_2O_3.0.05Ga_2O_3.0.28SiO_2.1.0CaCl_2$:
0.06Ce,0.03Eu
$0.5Y_2O_3.SrO.3.27Al_2O_3.0.05Ga_2O_3.1.2SiO_2.0.1SrF_2$:
0.007Ce,0.04Eu
$1.0La_2O_3.SrO.2.76Al_2O_3.0.05Ga_2O_3.1.12SiO_2.0.2SrCl_2$:
0.09Ce,0.03Eu
$2.0Y_2O_3.SrO.1.75Al_2O_3.0.05Ga_2O_3.1.04SiO_2.0.3BaCl_2$:
0.1Ce,0.1Eu
$0.47Pr_2O_3.0.5Gd_2O_3.0.5Sm_2O_3.SrO.2.3Al_2O_3.1.34SiO_2.0.06BaF_2$:0.1Ce,0.11Eu
$0.47Y_2O_3Gd_2O_3.SrO.2.29Al_2O_3.1.36SiO_2.0.06BaF_2$:
0.07Ce,0.02Eu
$0.47Y_2O_3Gd_2O_3.SrO.2.23Al_2O_3.1.38SiO_2.0.12LiF$:
0.12Ce,0.02Eu
$0.47Nd_2O_3Gd_2O_3.SrO.2.22Al_2O_3.1.4SiO_2.0.12LiCl$:
0.02Ce,0.11Eu
$0.44Y_2O_3Gd_2O_3.SrO.2.21Al_2O_3.1.42SiO_2.0.12NaF$:
0.02Ce,0.02Eu
$0.44Y_2O_3Gd_2O_3.SrO.2.2Al_2O_3.1.44SiO_2.0.12NaCl$:
0.08Ce,0.08Eu
$0.41Y_2O_3Gd_2O_3.SrO.2.19Al_2O_3.1.43SiO_2.0.12KF$:
0.07Ce,0.01Eu
$0.41Y_2O_3Gd_2O_3.SrO.2.42Al_2O_3.1.18SiO_2.0.12KCl$:
0.01Ce,0.03Eu
$0.38Y_2O_3.Gd_2O_3.SrO.2.19Al_2O_3.1.46SiO_2.0.06MgF_2$:
0.08Ce,0.10Eu
$0.38Y_2O_3.Gd_2O_3.SrO.2.18Al_2O_3.1.48SiO_2.0.06MgCl_2$:
0.1Ce,0.1Eu,0.1Tb
$0.35Y_2O_3.Gd_2O_3.SrO.1.46Al_2O_3.1.96SiO_2.0.06CaF_2$:
0.16Ce
$0.35Pr_2O_3.Gd_2O_3.SrO.2.17Al_2O_3.1.5SiO_2.0.06CaCl_2$:
0.12Ce,0.12Eu
$0.32Y_2O_3.Gd_2O_3.SrO.2.12Al_2O_3.1.6SiO_2.0.06SrF_2$:
0.12Ce,0.10Eu
$0.32Y_2O_3.Gd_2O_3.SrO.2.07Al_2O_3.1.7SiO_2.0.06SrCl_2$:
0.08Ce,0.12Eu
$0.29Y_2O_3.Gd_2O_3.SrO.2.02Al_2O_3.1.8SiO_2.0.06BaF_2$:
0.06Ce,0.10Eu and
$0.29Nd_2O_3.Gd_2O_3.SrO.1.97Al_2O_3.1.9SiO_2.0.06BaCl_2$:
0.08Ce,0.10Eu.

2. A method of producing a phosphor, comprising:
weighing elementary substance or compounds or salts of Ln, M, M', halide of A, and compounds or salts of R and Si as raw materials with weights that are based on the stoichiometric ratio, and adding an excess quantity of $SiO_2$ and/or $AX_e$ as flux into the raw materials, then mixing and grinding to form a mixture;
baking the mixture at high temperature under reducing atmosphere; and
carrying out a post-treatment of the baked product to obtain the phosphor, wherein the phosphor is represented by a general formula of:

$$aLn_2O_3.MO.bM'_2O_3.fSiO_2.cAX_e:dR, \text{ wherein}$$

Ln is at least one metal element selected from a group consisting of Sc, Y, La, Pr, Nd, Gd, Ho, Yb and Sm;
M is at least one metal element selected from a group consisting of Ca, Sr, and Ba;
M' is at least one metal element selected from Al and Ga;
A is at least one metal element selected from a group consisting of Li, Na, K, Mg, Ca, Sr and Ba;
X is at least one element selected from F and Cl;
R is at least one metal element selected from a group consisting of Ce, Eu, Tb and Mn;
$0.01 \leq a \leq 2$;
$0.35 \leq b \leq 4$;
$0.01 \leq c \leq 1$;
$0.01 \leq d \leq 0.3$;
$0.01 \leq f \leq 3$; and
$0.65 \leq e \leq 2.4$, wherein the phosphor is a member from the group consisting of:
$1.47Y_2O_3.BaO.2.48Al_2O_3.1.03SiO_2.0.03BaF_2$:0.03Ce,
0.01Eu
$1.47Y_2O_3.BaO.2.47Al_2O_3.1.03SiO_2.0.06BaF_2$:0.04Ce,
0.03Eu
$Y_2O_3.0.48Sm_2O_3.BaO.2.45Al_2O_3.1.09SiO_2.0.06BaF_2$:
0.03Ce,0.04Eu
$La_2O_3.0.22Gd_2O_3.0.25Sm_2O_3.BaO.2.44Al_2O_3.1.12SiO_2.0.06BaF_2$:0.06Ce,0.01Eu,0.001Tb
$2.0Y_2O_3.BaO.1.0Al_2O_3.0.05Ga_2O_3.2.5SiO_2.0.36BaF_2$:
0.07Ce,0.03Eu,0.001Tb
$1.91Y_2O_3.BaO.2.01Al_2O_3.1.06SiO_2.0.1LiF$:0.09Ce,
0.02Eu,0.001Tb
$1.34Pr_2O_3.BaO.2.5Al_2O_3.1.09SiO_2.0.16LiCl$:0.01Ce,
0.08Eu,0.002Tb
$0.818Y_2O_3.BaO.3.0Al_2O_3.1.12SiO_2.0.2NaF$:0.1Ce,
0.04Eu,0.003Tb
$0.297Y_2O_3.BaO.3.5Al_2O_3.1.15SiO_2.0.2NaCl$:0.12Ce,
0.02Eu,0.004Tb
$0.01Y_2O_3.BaO.4.0Al_2O_3.0.01SiO_2.0.918KF$:0.02Ce,
0.1Eu,0.001Tb
$1.473Nd_2O_3.BaO.2.79Al_2O_3.0.05SiO_2.0.37KCl$:0.02Ce,
0.11Eu,0.002Tb
$1.471Y_2O_3.BaO.2.81Al_2O_3.0.1SiO_2.0.28MgF_2$:0.1Ce,
0.12Eu,0.003Mn
$1.472Y_2O_3.BaO.2.61Al_2O_3.0.5SiO_2.0.28MgCl_2$:0.13Ce,
0.01Eu,0.001 Mn 1.482$Y_2O_3$.BaO.2.215$Al_2O_3$.1.0$SiO_2$.0.57$CaF_2$:0.01Ce, 0.12Eu,0.004Mn
1.133$Ho_2O_3$.BaO.2.2$Al_2O_3$.2.0$SiO_2$.0.3$CaCl_2$:0.1Ce, 0.02Eu,0.001Tb
0.8$Y_2O_3$.BaO.0.42$Al_2O_3$.3.0$SiO_2$.0.16$SrF_2$:0.01Ce, 0.1Eu,0.003Tb
1.47$Y_2O_3$.BaO.2.42$Al_2O_3$.$SiO_2$.0.16$SrCl_2$:0.1Ce,0.04Eu
$Yb_2O_3$.0.47$Gd_2O_3$.BaO.2.24$Al_2O_3$.1.36$SiO_2$.0.16LiF: 0.13Ce,0.01Eu
$Y_2O_3$.0.44$Gd_2O_3$.BaO.2.25$Al_2O_3$.1.39$SiO_2$.0.16LiCl: 0.08Ce,0.09Eu
$Y_2O_3$.0.44$Gd_2O_3$.BaO.2.21$Al_2O_3$.1.42$SiO_2$.0.16NaF: 0.09Ce,0.02Eu
$Y_2O_3$.0.41$Gd_2O_3$.BaO.2.195$Al_2O_3$.1.45$SiO_2$.0.16NaCl: 0.15Ce,0.13Eu
$Y_2O_3$.0.41$Gd_2O_3$.BaO.2.18$Al_2O_3$.1.48$SiO_2$.0.16KF: 0.01Ce,0.01Eu
$Y_2O_3$.0.38$Gd_2O_3$.CaO.2.42$Al_2O_3$.1.48$SiO_2$.0.16KCl: 0.03Ce,0.03Eu
$Y_2O_3$.0.38$Gd_2O_3$.CaO.2.165$Al_2O_3$.1.51$SiO_2$.0.16$MgF_2$: 0.08Ce,0.002Tb
$Y_2O_3$.0.35$Sc_2O_3$.CaO.2.15$Al_2O_3$.1.54$SiO_2$.0.16$MgCl_2$: 0.02Ce,0.005Tb
$Y_2O_3$.0.35$Gd_2O_3$.CaO.2.3$Al_2O_3$.1.12$SiO_2$.0.16$CaF_2$: 0.04Ce,0.001Tb
$Y_2O_3$.0.32$Gd_2O_3$.CaO.2.135$Al_2O_3$.1.57$SiO_2$.0.16$CaCl_2$: 0.07Ce,0.08Eu
$Y_2O_3$.0.32$La_2O_3$.CaO.2.12$Al_2O_3$.1.6$SiO_2$.0.16$SrF_2$: 0.02Ce,0.12Eu
$Y_2O_3$.0.29$Gd_2O_3$CaO.2.105$Al_2O_3$.1.63$SiO_2$.0.16$SrCl_2$: 0.14Ce,0.02Eu
$Y_2O_3$.0.29$Pr_2O_3$CaO.2.09$Al_2O_3$.1.66$SiO_2$.0.16$BaCl_2$: 0.02Ce,0.02Eu
$Y_2O_3$.0.26$Sm_2O_3$.CaO.2.125$Al_2O_3$.1.74$SiO_2$.0.01LiF: 0.06Ce,0.06Eu
$Y_2O_3$.0.26$Sm_2O_3$.CaO.2.11$Al_2O_3$.1.75$SiO_2$.0.03LiCl: 0.09Ce,0.08Eu
$Y_2O_3$.0.23$Sm_2O_3$.CaO.2.095$Al_2O_3$.1.75$SiO_2$.0.06NaF: 0.06Ce,0.07Eu
$Y_2O_3$.0.23$Sm_2O_3$.CaO.2.08$Al_2O_3$.1.74$SiO_2$.0.1NaCl: 0.05Ce,0.08Eu
$Y_2O_3$.0.2$Sm_2O_3$.CaO.2.065$Al_2O_3$.1.67$SiO_2$.0.2KF: 0.16Ce,0.13Eu
$Y_2O_3$.0.2$Sm_2O_3$.CaO.2.05$Al_2O_3$.1.6$SiO_2$.0.3KCl: 0.15Ce,0.13Eu
$Y_2O_3$.0.47$Sm_2O_3$.CaO.2.23$Al_2O_3$.0.9$SiO_2$.0.4$MgF_2$: 0.13Ce,0.1Eu
$Y_2O_3$.0.47$Nd_2O_3$.CaO.2.035$Al_2O_3$.1.43$SiO_2$.0.5$MgCl_2$: 0.04Ce,0.04Eu
$Y_2O_3$.0.47$Sm_2O_3$.CaO.2.02$Al_2O_3$.1.36$SiO_2$.0.6$CaF_2$: 0.02Ce,0.03Eu
$Y_2O_3$.0.47$Sm_2O_3$.CaO.2.005$Al_2O_3$.1.29$SiO_2$.0.7$CaCl_2$: 0.12Ce,0.03Eu
$Y_2O_3$.0.47$Sm_2O_3$.CaO.1.99$Al_2O_3$.1.22$SiO_2$.0.8$SrF_2$: 0.13Ce,0.04Eu
$Y_2O_3$.0.47$Sm_2O_3$.CaO.2.46$Al_2O_3$.0.18$SiO_2$.0.9$SrCl_2$: 0.14Ce,0.05Eu
$Y_2O_3$.0.47$Ho_2O_3$.CaO.2.45$Al_2O_3$.0.1$SiO_2$.1.0$BaCl_2$: 0.06Ce,0.06Eu
1.47$Y_2O_3$.CaO.2.39$Al_2O_3$.0.05$Ga_2O_3$.1.08$SiO_2$.0.1LiF: 0.08Ce,0.05Eu
0.01$Y_2O_3$CaO.3.84$Al_2O_3$.0.05$Ga_2O_3$.1.00$SiO_2$.0.2LiCl: 0.11Ce,0.02Eu
0.05$Yb_2O_3$CaO.3.36$Al_2O_3$.0.05$Ga_2O_3$.1.3$SiO_2$.0.3NaF: 0.1Ce,0.05Eu
0.1$Y_2O_3$CaO.3.74$Al_2O_3$.0.05$Ga_2O_3$.0.82$SiO_2$.0.4NaCl: 0.1Ce,0.03Eu
0.5$Y_2O_3$CaO.3.33$Al_2O_3$.0.05$Ga_2O_3$.0.74$SiO_2$.0.5KF: 0.09Ce,0.02Eu
1.0$Y_2O_3$CaO.2.82$Al_2O_3$.0.05$Ga_2O_3$.0.66$SiO_2$.0.6KCl: 0.08Ce
2.0$Y_2O_3$CaO.1.81$Al_2O_3$.0.05$Ga_2O_3$.0.55$SiO_2$.0.7$MgF_2$: 0.1Eu
0.01$Sc_2O_3$.SrO.3.79$Al_2O_3$.0.05$Ga_2O_3$.0.44$SiO_2$.0.8$MgCl_2$:0.007Ce,0.01Eu
0.05$Y_2O_3$.SrO.3.74$Al_2O_3$.0.05$Ga_2O_3$.0.36$SiO_2$.0.9$CaF_2$: 0.06Ce,0.04Eu
0.1$Y_2O_3$.SrO.3.68$Al_2O_3$.0.05$Ga_2O_3$.0.28$SiO_2$.1.0$CaCl_2$: 0.06Ce,0.03Eu
0.5$Y_2O_3$.SrO.3.27$Al_2O_3$.0.05$Ga_2O_3$.1.2$SiO_2$.0.1$SrF_2$: 0.007Ce,0.04Eu
1.0$La_2O_3$.SrO.2.76$Al_2O_3$.0.05$Ga_2O_3$.1.12$SiO_2$.0.2$SrCl_2$: 0.09Ce,0.03Eu
2.0$Y_2O_3$.SrO.1.75$Al_2O_3$.0.05$Ga_2O_3$.1.04$SiO_2$.0.3$BaCl_2$: 0.1Ce,0.1Eu
0.47$Pr_2O_3$.0.5$Gd_2O_3$.0.5$Sm_2O_3$.SrO.2.3$Al_2O_3$.1.34$SiO_2$.0.06$BaF_2$:0.1Ce,0.11Eu
0.47$Y_2O_3$.$Gd_2O_3$.SrO.2.29$Al_2O_3$.1.36$SiO_2$.0.06$BaF_2$: 0.07Ce,0.02Eu
0.47$Y_2O_3$.$Gd_2O_3$.SrO.2.23$Al_2O_3$.1.38$SiO_2$.0.12LiF: 0.12Ce,0.02Eu
0.47$Nd_2O_3$.$Gd_2O_3$.SrO.2.22$Al_2O_3$.1.4$SiO_2$.0.12LiCl: 0.02Ce,0.11Eu
0.44$Y_2O_3$.$Gd_2O_3$.SrO.2.21$Al_2O_3$.1.42$SiO_2$.0.12NaF: 0.02Ce,0.02Eu
0.44$Y_2O_3$.$Gd_2O_3$.SrO.2.2$Al_2O_3$.1.44$SiO_2$.0.12NaCl: 0.08Ce,0.08Eu
0.41$Y_2O_3$.$Gd_2O_3$.SrO.2.19$Al_2O_3$.1.43$SiO_2$.0.12KF: 0.07Ce,0.01Eu
0.41$Y_2O_3$.$Gd_2O_3$.SrO.2.42$Al_2O_3$.1.18$SiO_2$.0.12KCl: 0.01Ce,0.03Eu
0.38$Y_2O_3$.$Gd_2O_3$.SrO.2.19$Al_2O_3$.1.46$SiO_2$.0.06$MgF_2$: 0.08Ce,0.10Eu
0.38$Y_2O_3$.$Gd_2O_3$.SrO.2.18$Al_2O_3$.1.48$SiO_2$.0.06$MgCl_2$: 0.1Ce,0.1Eu,0.1Tb
0.35$Y_2O_3$.$Gd_2O_3$.SrO.1.46$Al_2O_3$.1.96$SiO_2$.0.06$CaF_2$: 0.16Ce
0.35$Pr_2O_3$.$Gd_2O_3$.SrO.2.17$Al_2O_3$.1.5$SiO_2$.0.06$CaCl_2$: 0.12Ce,0.12Eu
0.32$Y_2O_3$.$Gd_2O_3$.SrO.2.12$Al_2O_3$.1.6$SiO_2$.0.06$SrF_2$: 0.12Ce,0.10Eu
0.32$Y_2O_3$.$Gd_2O_3$.SrO.2.07$Al_2O_3$.1.7$SiO_2$.0.06$SrCl_2$: 0.08Ce,0.12Eu
0.29$Y_2O_3$.$Gd_2O_3$.SrO.2.02$Al_2O_3$.1.8$SiO_2$.0.06$BaF_2$: 0.06Ce,0.10Eu and
0.29$Nd_2O_3$.$Gd_2O_3$.SrO.1.97$Al_2O_3$.1.9$SiO_2$.0.06$BaCl_2$: 0.08Ce,0.10Eu.

3. The method according to claim 2, wherein the compounds of Ln, M, M', A, R and Si are selected from the group consisting of corresponding oxide, hydroxide, carbonate, nitrate, and organic salt.

4. The method according to claim 2, wherein the amount of flux is in a range between 0.001% to 20% by weight of the total phosphor.

5. The method according to claim 2, wherein baking is carried out at least two times.

6. The method according to claim 5, wherein the temperature of baking is at a range between 500° C. to 1600° C.

7. The method according to claim 4 or 6, wherein each baking operation should last from 0.5 h to 15 h.

8. The method according to claim 2, wherein the post-treatment includes grinding, air flow crushing, washing, sifting, drying and grading.

9. The method according to claim 8, wherein the washing step in the post-treatment can be carried out using acid solution, alkali solution or water.

10. The method according to claim 8, wherein the grading step in the post-treatment is carried out with at least one method selected from a group consisting of sedimentation method, sieving method, hydraulic classification and air flow grading.

11. A light emitting device comprising:
a phosphor; and
a semiconductor light emitting element capable of emitting a light in the range from ultraviolet light to visible light, wherein
the phosphor is represented by a general formula of:

$$a\text{Ln}_2\text{O}_3 \cdot \text{MO} \cdot b\text{M}'_2\text{O}_3 \cdot f\text{SiO}_2 \cdot c\text{AX}_e : d\text{R}, \text{ wherein}$$

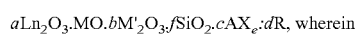

Ln is at least one metal element selected from a group consisting of Sc, Y, La, Pr, Nd, Gd, Ho, Yb and Sm;
M is at least one metal element selected from a group consisting of Ca, Sr and Ba;
M' is at least one metal element selected from Al and Ga;
A is at least one metal element selected from a group consisting of Li, Na, K, Mg, Ca, Sr and Ba;
X is at least one element selected from F and Cl;
R is at least one metal element selected from a group consisting of Ce, Eu, Tb and Mn;
$0.01 \leq a \leq 2$;
$0.35 \leq b \leq 4$;
$0.01 \leq c \leq 1$;
$0.01 \leq d \leq 0.3$;
$0.01 \leq f \leq 3$; and
$0.6 \leq e \leq 2.4$ wherein the phosphor is a member selected from the group consisting of:
$1.47Y_2O_3 \cdot BaO \cdot 2.48Al_2O_3 \cdot 1.03SiO_2 \cdot 0.03BaF_2 : 0.03Ce, 0.01Eu$
$1.47Y_2O_3 \cdot BaO \cdot 2.47Al_2O_3 \cdot 1.03SiO_2 \cdot 0.06BaF_2 : 0.04Ce, 0.03Eu$
$Y_2O_3 \cdot 0.48Sm_2O_3 \cdot BaO \cdot 2.45Al_2O_3 \cdot 1.09SiO_2 \cdot 0.06BaF_2 : 0.03Ce, 0.04Eu$
$La_2O_3 \cdot 0.22Gd_2O_3 \cdot 0.25Sm_2O_3 \cdot BaO \cdot 2.44Al_2O_3 \cdot 1.12SiO_2 \cdot 0.06BaF_2 : 0.06Ce, 0.01Eu, 0.001Tb$
$2.0Y_2O_3 \cdot BaO \cdot 1.0Al_2O_3 \cdot 0.05Ga_2O_3 \cdot 2.5SiO_2 \cdot 0.36BaF_2 : 0.07Ce, 0.03Eu, 0.001Tb$
$1.91Y_2O_3 \cdot BaO \cdot 2.01Al_2O_3 \cdot 1.06SiO_2 \cdot 0.1LiF : 0.09Ce, 0.02Eu, 0.001Tb$
$1.34Pr_2O_3 \cdot BaO \cdot 2.5Al_2O_3 \cdot 1.09SiO_2 \cdot 0.16LiCl : 0.01Ce, 0.08Eu, 0.002Tb$
$0.818Y_2O_3 \cdot BaO \cdot 3.0Al_2O_3 \cdot 1.12SiO_2 \cdot 0.2NaF : 0.1Ce, 0.04Eu, 0.003Tb$
$0.297Y_2O_3 \cdot BaO \cdot 3.5Al_2O_3 \cdot 1.15SiO_2 \cdot 0.2NaCl : 0.12Ce, 0.02Eu, 0.004Tb$
$0.01Y_2O_3 \cdot BaO \cdot 4.0Al_2O_3 \cdot 0.01SiO_2 \cdot 0.918KF : 0.02Ce, 0.1Eu, 0.001Tb$
$1.473Nd_2O_3 \cdot BaO \cdot 2.79Al_2O_3 \cdot 0.05SiO_2 \cdot 0.37KCl : 0.02Ce, 0.11Eu, 0.002Tb$
$1.471Y_2O_3 \cdot BaO \cdot 2.81Al_2O_3 \cdot 0.1SiO_2 \cdot 0.28MgF_2 : 0.1Ce, 0.12Eu, 0.003Mn$
$1.472Y_2O_3 \cdot BaO \cdot 2.61Al_2O_3 \cdot 0.5SiO_2 \cdot 0.28MgCl_2 : 0.13Ce, 0.01Eu, 0.001 Mn$
$1.482Y_2O_3 \cdot BaO \cdot 2.215Al_2O_3 \cdot 1.0SiO_2 \cdot 0.57CaF_2 : 0.01Ce, 0.12Eu, 0.004Mn$
$1.133Ho_2O_3 \cdot BaO \cdot 2.2Al_2O_3 \cdot 2.0SiO_2 \cdot 0.3CaCl_2 : 0.1Ce, 0.02Eu, 0.001Tb$
$0.8Y_2O_3 \cdot BaO \cdot 0.42Al_2O_3 \cdot 3.0SiO_2 \cdot 0.16SrF_2 : 0.01Ce, 0.1Eu, 0.003Tb$
$1.47Y_2O_3 \cdot BaO \cdot 2.42Al_2O_3 SiO_2 \cdot 0.16SrCl_2 : 0.1Ce, 0.04Eu$
$Yb_2O_3 \cdot 0.47Gd_2O_3 \cdot BaO \cdot 2.24Al_2O_3 \cdot 1.36SiO_2 \cdot 0.16LiF : 0.13Ce, 0.01Eu$
$Y_2O_3 \cdot 0.44Gd_2O_3 \cdot BaO \cdot 2.25Al_2O_3 \cdot 1.39SiO_2 \cdot 0.16LiCl : 0.08Ce, 0.09Eu$
$Y_2O_3 \cdot 0.44Gd_2O_3 \cdot BaO \cdot 2.21Al_2O_3 \cdot 1.42SiO_2 \cdot 0.16NaF : 0.09Ce, 0.02Eu$
$Y_2O_3 \cdot 0.41Gd_2O_3 \cdot BaO \cdot 2.195Al_2O_3 \cdot 1.45SiO_2 \cdot 0.16NaCl : 0.15Ce, 0.13Eu$
$Y_2O_3 \cdot 0.41Gd_2O_3 \cdot BaO \cdot 2.18Al_2O_3 \cdot 1.48SiO_2 \cdot 0.16KF : 0.01Ce, 0.01Eu$
$Y_2O_3 \cdot 0.38Gd_2O_3 \cdot CaO \cdot 2.42Al_2O_3 \cdot 1.48SiO_2 \cdot 0.16KCl : 0.03Ce, 0.03Eu$
$Y_2O_3 \cdot 0.38Gd_2O_3 \cdot CaO \cdot 2.165Al_2O_3 \cdot 1.51SiO_2 \cdot 0.16MgF_2 : 0.08Ce, 0.002Tb$
$Y_2O_3 \cdot 0.35Sc_2O_3 \cdot CaO \cdot 2.15Al_2O_3 \cdot 1.54SiO_2 \cdot 0.16MgCl_2 : 0.02Ce, 0.005Tb$
$Y_2O_3 \cdot 0.35Gd_2O_3 \cdot CaO \cdot 2.3Al_2O_3 \cdot 1.12SiO_2 \cdot 0.16CaF_2 : 0.04Ce, 0.001Tb$
$Y_2O_3 \cdot 0.32Gd_2O_3 \cdot CaO \cdot 2.135Al_2O_3 \cdot 1.57SiO_2 \cdot 0.16CaCl_2 : 0.07Ce, 0.08Eu$
$Y_2O_3 \cdot 0.32La_2O_3 \cdot CaO \cdot 2.12Al_2O_3 \cdot 1.6SiO_2 \cdot 0.16SrF_2 : 0.02Ce, 0.12Eu$
$Y_2O_3 \cdot 0.29Gd_2O_3 CaO \cdot 2.105Al_2O_3 \cdot 1.63SiO_2 \cdot 0.16SrCl_2 : 0.14Ce, 0.02Eu$
$Y_2O_3 \cdot 0.29Pr_2O_3 CaO \cdot 2.09Al_2O_3 \cdot 1.66SiO_2 \cdot 0.16BaCl_2 : 0.02Ce, 0.02Eu$
$Y_2O_3 \cdot 0.26Sm_2O_3 \cdot CaO \cdot 2.125Al_2O_3 \cdot 1.74SiO_2 \cdot 0.01LiF : 0.06Ce, 0.06Eu$
$Y_2O_3 \cdot 0.26Sm_2O_3 \cdot CaO \cdot 2.11Al_2O_3 \cdot 1.75SiO_2 \cdot 0.03LiCl : 0.09Ce, 0.08Eu$
$Y_2O_3 \cdot 0.23Sm_2O_3 \cdot CaO \cdot 2.095Al_2O_3 \cdot 1.75SiO_2 \cdot 0.06NaF : 0.06Ce, 0.07Eu$
$Y_2O_3 \cdot 0.23Sm_2O_3 \cdot CaO \cdot 2.08Al_2O_3 \cdot 1.74SiO_2 \cdot 0.1NaCl : 0.05Ce, 0.08Eu$
$Y_2O_3 \cdot 0.2Sm_2O_3 \cdot CaO \cdot 2.065Al_2O_3 \cdot 1.67SiO_2 \cdot 0.2KF : 0.16Ce, 0.13Eu$
$Y_2O_3 \cdot 0.2Sm_2O_3 \cdot CaO \cdot 2.05Al_2O_3 \cdot 1.6SiO_2 \cdot 0.3KCl : 0.15Ce, 0.13Eu$
$Y_2O_3 \cdot 0.47Sm_2O_3 \cdot CaO \cdot 2.23Al_2O_3 \cdot 0.9SiO_2 \cdot 0.4MgF_2 : 0.13Ce, 0.1Eu$
$Y_2O_3 \cdot 0.47Nd_2O_3 \cdot CaO \cdot 2.035Al_2O_3 \cdot 1.43SiO_2 \cdot 0.5MgCl_2 : 0.04Ce, 0.04Eu$
$Y_2O_3 \cdot 0.47Sm_2O_3 \cdot CaO \cdot 2.02Al_2O_3 \cdot 1.36SiO_2 \cdot 0.6CaF_2 : 0.02Ce, 0.03Eu$
$Y_2O_3 \cdot 0.47Sm_2O_3 \cdot CaO \cdot 2.005Al_2O_3 \cdot 1.29SiO_2 \cdot 0.7CaCl_2 : 0.12Ce, 0.03Eu$
$Y_2O_3 \cdot 0.47Sm_2O_3 \cdot CaO \cdot 1.99Al_2O_3 \cdot 1.22SiO_2 \cdot 0.8SrF_2 : 0.13Ce, 0.04Eu$
$Y_2O_3 \cdot 0.47Sm_2O_3 \cdot CaO \cdot 2.46Al_2O_3 \cdot 0.18SiO_2 \cdot 0.9SrCl_2 : 0.14Ce, 0.05Eu$
$Y_2O_3 \cdot 0.47Ho_2O_3 \cdot CaO \cdot 2.45Al_2O_3 \cdot 0.1SiO_2 \cdot 1.0BaCl_2 : 0.06Ce, 0.06Eu$
$1.47Y_2O_3 \cdot CaO \cdot 2.39Al_2O_3 \cdot 0.05Ga_2O_3 \cdot 1.08SiO_2 \cdot 0.1LiF : 0.08Ce, 0.05Eu$
$0.01Y_2O_3 CaO \cdot 3.84Al_2O_3 \cdot 0.05Ga_2O_3 \cdot 1.00SiO_2 \cdot 0.2LiCl : 0.11Ce, 0.02Eu$
$0.05Yb_2O_3 CaO \cdot 3.36Al_2O_3 \cdot 0.05Ga_2O_3 \cdot 1.3SiO_2 \cdot 0.3NaF : 0.1Ce, 0.05Eu$
$0.1Y_2O_3 CaO \cdot 3.74Al_2O_3 \cdot 0.05Ga_2O_3 \cdot 0.82SiO_2 \cdot 0.4NaCl : 0.1Ce, 0.03Eu$
$0.5Y_2O_3 CaO \cdot 3.33Al_2O_3 \cdot 0.05Ga_2O_3 \cdot 0.74SiO_2 \cdot 0.5KF : 0.09Ce, 0.02Eu$
$1.0Y_2O_3 CaO \cdot 2.82Al_2O_3 \cdot 0.05Ga_2O_3 \cdot 0.66SiO_2 \cdot 0.6KCl : 0.08Ce$
$2.0Y_2O_3 CaO \cdot 1.81Al_2O_3 \cdot 0.05Ga_2O_3 \cdot 0.55SiO_2 \cdot 0.7MgF_2 : 0.1Eu$ $0.01Sc_2O_3.SrO.3.79Al_2O_3.0.05Ga_2O_3.0.44SiO_2.0.8MgCl_2:0.007Ce,0.01Eu$ $0.05Y_2O_3.SrO.3.74Al_2O_3.0.05Ga_2O_3.0.36SiO_2.0.9CaF_2:0.06Ce,0.04Eu$ $0.1Y_2O_3.SrO.3.68Al_2O_3.0.05Ga_2O_3.0.28SiO_2.1.0CaCl_2:0.06Ce,0.03Eu$ $0.5Y_2O_3.SrO.3.27Al_2O_3.0.05Ga_2O_3.1.2SiO_2.0.1SrF_2:0.007Ce,0.04Eu$ $1.0La_2O_3.SrO.2.76Al_2O_3.0.05Ga_2O_3.1.12SiO_2.0.2SrCl_2:0.09Ce,0.03Eu$ $2.0Y_2O_3.SrO.1.75Al_2O_3.0.05Ga_2O_3.1.04SiO_2.0.3BaCl_2:0.1Ce,0.1Eu$ $0.47Pr_2O_3.0.5Gd_2O_3.0.5Sm_2O_3.SrO.2.3Al_2O_3.1.34SiO_2.0.06BaF_2:0.1Ce,0.11Eu$ $0.47Y_2O_3.Gd_2O_3.SrO.2.29Al_2O_3.1.36SiO_2.0.06BaF_2:0.07Ce,0.02Eu$ $0.47Y_2O_3.Gd_2O_3.SrO.2.23Al_2O_3.1.38SiO_2.0.12LiF:0.12Ce,0.02Eu$ $0.47Nd_2O_3.Gd_2O_3.SrO.2.22Al_2O_3.1.4SiO_2.0.12LiCl:0.02Ce,0.11Eu$ $0.44Y_2O_3.Gd_2O_3.SrO.2.21Al_2O_3.1.42SiO_2.0.12NaF:0.02Ce,0.02Eu$ $0.44Y_2O_3.Gd_2O_3.SrO.2.2Al_2O_3.1.44SiO_2.0.12NaCl:0.08Ce,0.08Eu$ $0.41Y_2O_3.Gd_2O_3.SrO.2.19Al_2O_3.1.43SiO_2.0.12KF:0.07Ce,0.01Eu$ $0.41Y_2O_3.Gd_2O_3.SrO.2.42Al_2O_3.1.18SiO_2.0.12KCl:0.01Ce,0.03Eu$ $0.38Y_2O_3.Gd_2O_3.SrO.2.19Al_2O_3.1.46SiO_2.0.06MgF_2:0.08Ce,0.10Eu$ $0.38Y_2O_3.Gd_2O_3.SrO.2.18Al_2O_3.1.48SiO_2.0.06MgCl_2:0.1Ce,0.1Eu,0.1Tb$ $0.35Y_2O_3.Gd_2O_3.SrO.1.46Al_2O_3.1.96SiO_2.0.06CaF_2:0.16Ce$ $0.35Pr_2O_3.Gd_2O_3.SrO.2.17Al_2O_3.1.5SiO_2.0.06CaCl_2:0.12Ce,0.12Eu$ $0.32Y_2O_3.Gd_2O_3.SrO.2.12Al_2O_3.1.6SiO_2.0.06SrF_2:0.12Ce,0.10Eu$ $0.32Y_2O_3.Gd_2O_3.SrO.2.07Al_2O_3.1.7SiO_2.0.06SrCl_2:0.08Ce,0.12Eu$ $0.29Y_2O_3.Gd_2O_3.SrO.2.02Al_2O_3.1.8SiO_2.0.06BaF_2:0.06Ce,0.10Eu$ and $0.29Nd_2O_3.Gd_2O_3.SrO.1.97Al_2O_3.1.9SiO_2.0.06BaCl_2:0.08Ce,0.10Eu$.

\* \* \* \* \*

UNITED STATES PATENT AND TRADEMARK OFFICE
CERTIFICATE OF CORRECTION

PATENT NO. : 7,955,524 B2
APPLICATION NO. : 12/232604
DATED : June 7, 2011
INVENTOR(S) : Weidong Zhuang et al.

It is certified that error appears in the above-identified patent and that said Letters Patent is hereby corrected as shown below:

Column 7, Line 47, In Claim 1, delete "$0.01 \leq c \leq 1$," and insert -- $0.01 \leq c \leq 1$; --, therefor.
Column 7, Line 62, In Claim 1, delete "BaO.2.01" and insert -- BaO.2.0 --, therefor.
Column 8, Line 33, In Claim 1, delete "$Al_2O_3SiO_2$" and insert -- $Al_2O_3.SiO_2$ --, therefor.
Column 8, Line 56, In Claim 1, delete "$Gd_2O_3CaO$" and insert -- $Gd_2O_3.CaO$ --, therefor.
Column 8, Line 58, In Claim 1, delete "$Pr_2O_3CaO$" and insert -- $Pr_2O_3.CaO$ --, therefor.
Column 9, Line 22, In Claim 1, delete "$Y_2O_3CaO$" and insert -- $Y_2O_3.CaO$ --, therefor.
Column 9, Line 24, In Claim 1, delete "$Yb_2O_3CaO$" and insert -- $Yb_2O_3.CaO$ --, therefor.
Column 9, Line 26, In Claim 1, delete "$Y_2O_3CaO$" and insert -- $Y_2O_3.CaO$ --, therefor.
Column 9, Line 28, In Claim 1, delete "$Y_2O_3CaO$" and insert -- $Y_2O_3.CaO$ --, therefor.
Column 9, Line 30, In Claim 1, delete "$Y_2O_3CaO$" and insert -- $Y_2O_3.CaO$ --, therefor.
Column 9, Line 32, In Claim 1, delete "$Y_2O_3CaO$" and insert -- $Y_2O_3.CaO$ --, therefor.
Column 9, Line 41, In Claim 1, delete "0.007Ce," and insert -- 0.07Ce, --, therefor.
Column 9, Line 48, In Claim 1, delete "$Y_2O_3Gd_2O_3$" and insert -- $Y_2O_3.Gd_2O_3$ --, therefor.
Column 9, Line 50, In Claim 1, delete "$Y_2O_3Gd_2O_3$" and insert -- $Y_2O_3.Gd_2O_3$ --, therefor.
Column 9, Line 52, In Claim 1, delete "$Nd_2O_3Gd_2O_3$" and insert -- $Nd_2O_3.Gd_2O_3$ --, therefor.
Column 9, Line 54, In Claim 1, delete "$Y_2O_3Gd_2O_3$" and insert -- $Y_2O_3.Gd_2O_3$ --, therefor.
Column 9, Line 56, In Claim 1, delete "$Y_2O_3Gd_2O_3$" and insert -- $Y_2O_3.Gd_2O_3$ --, therefor.
Column 9, Line 58, In Claim 1, delete "$Y_2O_3Gd_2O_3$" and insert -- $Y_2O_3.Gd_2O_3$ --, therefor.
Column 9, Line 60, In Claim 1, delete "$Y_2O_3Gd_2O_3$" and insert -- $Y_2O_3.Gd_2O_3$ --, therefor.
Column 10, Line 40, In Claim 2, delete "$0.65 \leq e \leq 2.4$," and insert -- $0.6 \leq e \leq 2.4$, --, therefor.
Column 10, Line 52, In Claim 2, delete "BaO.2.01" and insert -- BaO.2.0 --, therefor.
Column 11, Line 7, In Claim 2, delete "$Al_2O_3SiO_2$" and insert -- $Al_2O_3.SiO_2$ --, therefor.
Column 11, Line 30, In Claim 2, "$Gd_2O_3CaO$" and insert -- $Gd_2O_3.CaO$ --, therefor.
Column 11, Line 32, In Claim 2, delete "$Pr_2O_3CaO$" and insert -- $Pr_2O_3.CaO$ --, therefor.
Column 11, Line 62, In Claim 2, delete "$Y_2O_3CaO$" and insert -- $Y_2O_3.CaO$ --, therefor.
Column 11, Line 64, In Claim 2, delete "$Yb_2O_3CaO$" and insert -- $Yb_2O_3.CaO$ --, therefor.
Column 11, Line 66, In Claim 2, delete "$Y_2O_3CaO$" and insert -- $Y_2O_3.CaO$ --, therefor.
Column 12, Line 1, In Claim 2, delete "$Y_2O_3CaO$" and insert -- $Y_2O_3.CaO$ --, therefor.
Column 12, Line 3, In Claim 2, delete "$Y_2O_3CaO$" and insert -- $Y_2O_3.CaO$ --, therefor.

Signed and Sealed this
Eighteenth Day of October, 2011

David J. Kappos
*Director of the United States Patent and Trademark Office*

CERTIFICATE OF CORRECTION (continued)
U.S. Pat. No. 7,955,524 B2

Column 12, Line 5, In Claim 2, delete "$Y_2O_3CaO$" and insert -- $Y_2O_3.CaO$ --, therefor.
Column 12, Line 14, In Claim 2, delete "0.007Ce," and insert -- 0.07Ce, --, therefor.
Column 12, Line 22, In Claim 2, delete "$Y_2O_3Gd_2O_3$" and insert -- $Y_2O_3.Gd_2O_3$ --, therefor.
Column 12, Line 24, In Claim 2, delete "$Y_2O_3Gd_2O_3$" and insert -- $Y_2O_3.Gd_2O_3$ --, therefor.
Column 12, Line 26, In Claim 2, delete "$Nd_2O_3Gd_2O3$" and insert -- $Nd_2O_3.Gd_2O_3$ --, therefor.
Column 12, Line 28, In Claim 2, delete "$Y_2O_3Gd_2O_3$" and insert -- $Y_2O_3.Gd_2O_3$ --, therefor.
Column 12, Line 30, In Claim 2, delete "$Y_2O_3Gd_2O_3$" and insert -- $Y_2O_3.Gd_2O_3$ --, therefor.
Column 12, Line 32, In Claim 2, delete "$Y_2O_3Gd_2O_3$" and insert -- $Y_2O_3.Gd_2O_3$ --, therefor.
Column 12, Line 34, In Claim 2, delete "$Y_2O_3Gd_2O_3$" and insert -- $Y_2O_3.Gd_2O_3$ --, therefor.
Column 12, Line 63, In Claim 7, delete "4 or 6," and insert -- 5 or 6, --, therefor.
Column 13, Line 33, In Claim 11, after "2.4" insert -- , --.
Column 13, Line 45, In Claim 11, delete "BaO.2.01" and insert -- BaO.2.0 --, therefor.
Column 13, Line 67, In Claim 11, delete "$Al_2O_3SiO_2$" and insert -- $Al_2O_3.SiO_2$ --, therefor.
Column 14, Line 24, In Claim 11, delete "$Gd_2O_3CaO$" and insert -- $Gd_2O_3.CaO$ --, therefor.
Column 14, Line 26, In Claim 11, delete "$Pr_2O_3CaO$" and insert -- $Pr_2O_3.CaO$ --, therefor.
Column 14, Line 56, In Claim 11, delete "$Y_2O_3CaO$" and insert -- $Y_2O_3.CaO$ --, therefor.
Column 14, Line 58, In Claim 11, delete "$Yb_2O_3CaO$" and insert -- $Yb_2O_3.CaO$ --, therefor.
Column 14, Line 60, In Claim 11, delete "$Y_2O_3CaO$" and insert -- $Y_2O_3.CaO$ --, therefor.
Column 14, Line 62, In Claim 11, delete "$Y_2O_3CaO$" and insert -- $Y_2O_3.CaO$ --, therefor.
Column 14, Line 64, In Claim 11, delete "$Y_2O_3CaO$" and insert -- $Y_2O_3.CaO$ --, therefor.
Column 14, Line 66, In Claim 11, delete "$Y_2O_3CaO$" and insert -- $Y_2O_3.CaO$ --, therefor.
Column 15, Line 8, In Claim 11, delete "0.007Ce," and insert -- 0.07Ce, --, therefor.
Column 15, Line 14, In Claim 11, delete "$Y_2O_3Gd_2O_3$" and insert -- $Y_2O_3.Gd_2O_3$ --, therefor.
Column 15, Line 16, In Claim 11, delete "$Y_2O_3Gd_2O_3$" and insert -- $Y_2O_3.Gd_2O_3$ --, therefor.
Column 15, Line 18, In Claim 11, delete "$Nd_2O_3Gd_2O_3$" and insert -- $Nd_2O_3.Gd_2O_3$ --, therefor.
Column 15, Line 20, In Claim 11, delete "$Y_2O_3Gd_2O_3$" and insert -- $Y_2O_3.Gd_2O_3$ --, therefor.
Column 15, Line 22, In Claim 11, delete "$Y_2O_3Gd_2O_3$" and insert -- $Y_2O_3.Gd_2O_3$ --, therefor.
Column 16, Line 1, In Claim 11, delete "$Y_2O_3Gd_2O_3$" and insert -- $Y_2O_3.Gd_2O_3$ --, therefor.
Column 16, Line 3, In Claim 11, delete "$Y_2O_3Gd_2O_3$" and insert -- $Y_2O_3.Gd_2O_3$ --, therefor.